United States Patent
Su et al.

(10) Patent No.: US 7,679,200 B2
(45) Date of Patent: Mar. 16, 2010

(54) SEMICONDUCTOR CHIP WITH CRACK STOP

(75) Inventors: Michael Z. Su, Round Rock, TX (US); Jaime Bravo, Austin, TX (US); Lei Fu, Austin, TX (US); Jun Zhai, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 240 days.

(21) Appl. No.: 11/853,122

(22) Filed: Sep. 11, 2007

(65) Prior Publication Data

US 2009/0065952 A1 Mar. 12, 2009

(51) Int. Cl.
*H01L 23/48* (2006.01)

(52) U.S. Cl. .................................... 257/778
(58) Field of Classification Search ................. 257/778, 257/E21.705, E23.063; 438/108
See application file for complete search history.

(56) References Cited

U.S. PATENT DOCUMENTS

| | | | |
|---|---|---|---|
| 6,049,124 A | | 4/2000 | Raiser et al. |
| 6,493,229 B2 | | 12/2002 | Akram et al. |
| 2002/0043721 A1 | | 4/2002 | Weber |
| 2006/0278957 A1* | | 12/2006 | Lin et al. ............ 257/620 |
| 2007/0069336 A1* | | 3/2007 | Ning ................. 257/619 |
| 2008/0083959 A1* | | 4/2008 | Wu et al. ............ 257/416 |

OTHER PUBLICATIONS

Guotao Wang et. al.; *Chip-packaging interaction: a critical concern for Cu/low k packaging*; www.sciencedirect.com; Microelectronics Reliability 45 (2005) 1079-1093.
Marie-Claude Paquet et al.; *Underfill Selection Strategy for Pb-Free, Low-K and Fine Pitch Organic Flip Chip Applications*; 2006 Electronic Components and Technology Conference; 1-4244-0152-6/06/$20.00 © 2006 IEEE; pp. 1595-1603.
John Baliga; *Yet Another Way to Use BCB*; Semiconductor International; http://www.semiconductor.net/article/CA6347341.html; Jul. 1, 2006; pp. 1-3.
U.S. Appl. No. 12/132,734, filed Jun. 4, 2008, Michael Su et al.
U.S. Appl. No. 12/388,064, filed Feb. 18, 2009, Michael Z. Su et al.
U.S. Appl. No. 12/388,092, filed Feb. 18, 2009, Michael Su et al.
USPTO Office Action notification date Oct. 27, 2009; U.S. Appl. No. 12/132,734.

* cited by examiner

*Primary Examiner*—Trung Dang
(74) *Attorney, Agent, or Firm*—Ditthavong, Mori & Steiner, P.C.

(57) ABSTRACT

Various semiconductor chip crack stops and methods of making the same are disclosed. In one aspect, a method of manufacturing is provided that includes providing a semiconductor substrate that has a first corner defined by a first edge and a second edge. A crack stop is formed in the semiconductor substrate. The crack stop includes a first projection extending to the first edge and a second projection extending to the second edge to fence off a portion of the semiconductor substrate that includes the first corner.

20 Claims, 4 Drawing Sheets

SEMICONDUCTOR CHIP WITH CRACK STOP

BACKGROUND OF THE INVENTION

1. Field of the Invention

This invention relates generally to semiconductor processing, and more particularly to semiconductor chip crack stops and to methods of making the same.

2. Description of the Related Art

Conventional semiconductor chips are routinely fabricated en masse in large groups as part of a single semiconductor wafer. At the conclusion of the processing steps to form the individual dice, a so-called dicing or sawing operation is performed on the wafer to cut out the individual dice. Thereafter, the dice may be packaged or directly mounted to a printed circuit board of one form or another. Conventional semiconductor dice are routinely cut out from the wafer as rectangular shapes. By definition, a conventional semiconductor die has four sides and four corners. The dicing operation is a mechanical cutting operation performed with a type of circular saw. Dicing saws are made with great care and operate more precisely than a comparable masonry circular saw. Despite these refinements, the dicing saw still imposes significant stresses on the individual dice as they are cut. These stresses and impact loads during the cutting operation can cause microscopic fractures in the dice, particularly at the die corners. Once the cut dice are mounted to a package substrate or printed circuit board of one sort or another, the cracks introduced during cutting may propagate further into the center of the dice due to thermal stresses and other mechanical stresses that may be placed on the die. In addition, new cracks may form, particularly near the corners which create so-called stress risers by virtue of their geometries.

A conventional technique for addressing the propagation of cracks from the corners of a die involves the use of a crack stop. A conventional crack stop consists of a frame-like structure formed in and near the edges of the semiconductor die. When viewed from above, the crack stop looks like a picture frame. The conventional crack stop does not extend out to the edges of the conventional die. Because of this geometry, a crack propagating from the corner of a die can achieve a significant length before encountering the die crack stop. If the crack achieves a certain critical length before encountering the conventional crack stop, the crack can become virtually uncontrollable. The crack can overwhelm the conventional crack stop and invade the active portion of the semiconductor die and lay waste to the delicate circuit structures positioned therein.

The present invention is directed to overcoming or reducing the effects of one or more of the foregoing disadvantages.

SUMMARY OF THE INVENTION

In accordance with one aspect of the present invention, a method of manufacturing is provided that includes providing a semiconductor substrate that has a first corner defined by a first edge and a second edge. A crack stop is formed in the semiconductor substrate. The crack stop includes a first projection extending to the first edge and a second projection extending to the second edge to fence off a portion of the semiconductor substrate that includes the first corner.

In accordance with another aspect of the present invention, a method of manufacturing is provided that includes providing a rectangular semiconductor substrate that has a first edge, a second edge, a third edge and a fourth edge that define a first corner, a second corner, a third corner and a fourth corner. A crack stop is formed in the semiconductor substrate. The crack stop includes a first projection, a second projection, a third projection, a fourth projection, a fifth projection, a sixth projection, a seventh projection and an eighth projection. The first projection extends to the first edge and the second projection extends to the second edge to fence off a portion of the semiconductor substrate that includes the first corner. The third projection extends to the second edge and the fourth projection extends to the third edge to fence off a portion of the semiconductor substrate that includes the second corner. The fifth projection extends to the third edge and the sixth projection extends to the fourth edge to fence off a portion of the semiconductor substrate that includes the third corner. The seventh projection extends to the fourth edge and the eighth projection extends to the first edge to fence off a portion of the semiconductor substrate that includes the fourth corner.

In accordance with another aspect of the present invention, a semiconductor chip is provided that includes a semiconductor substrate that has a first corner defined by a first edge and a second edge. A crack stop in the semiconductor substrate includes a first projection extending to the first edge and a second projection extending to the second edge to fence off a portion of the semiconductor substrate that includes the first corner.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
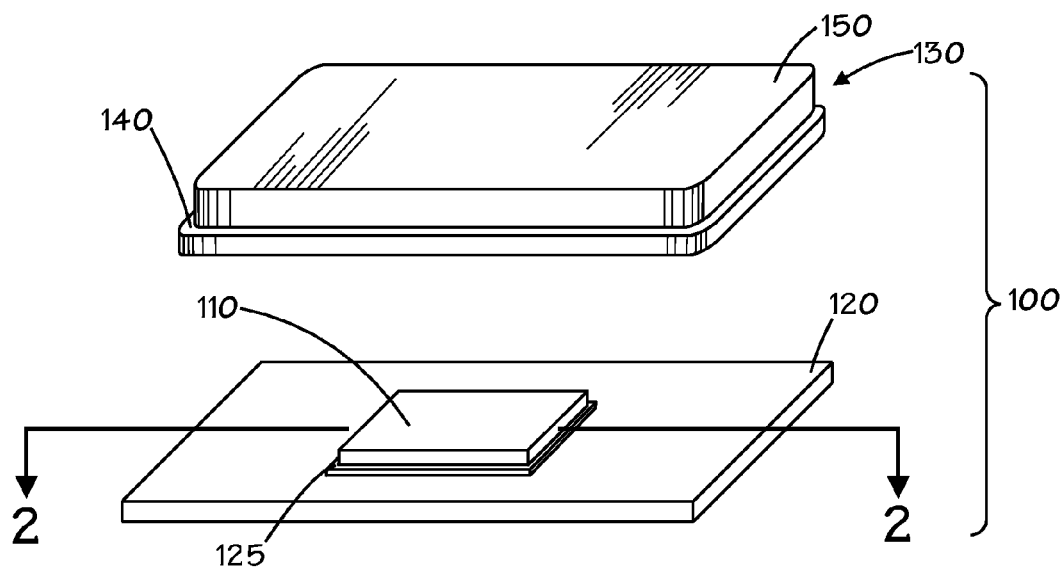
FIG. 1 is an exploded pictorial view of an exemplary embodiment of an integrated circuit package.

In the drawings described below, reference numerals are generally repeated where identical elements appear in more than one figure. Turning now to the drawings, and in particular to FIG. 1, therein is shown an exploded pictorial view of an exemplary embodiment of an integrated circuit package 100 that includes an integrated circuit 110 mounted on a package substrate 120. An underfill material 125 is positioned between the integrated circuit 110 and the substrate 120. The integrated circuit 110 may be fashioned as a semiconductor chip that is flip-chip mounted to the substrate 120. The semiconductor chip 110 may be any of a myriad of different types of circuit devices used in electronics, such as, for example, microprocessors, graphics processors, application specific integrated circuits, memory devices or the like, and may be single or multi-core. The semiconductor chip 110 may be fabricated using silicon, germanium or other semiconductor materials. If desired, the chip 110 may be fabricated as a semiconductor-on-insulator substrate. The semiconductor chip 110 may be electrically interconnected with the substrate 120 by a plurality of conductor structures that are not visible in FIG. 1.

The substrate 120 may be composed of ceramics or organic materials as desired. If organic, the substrate 120 may actually consist of multiple layers of metallization and dielectric materials that electrically interconnect the semiconductor chip 110 to some other component, such as a board (not shown). The substrate 120 may interconnect electrically with external devices, such as another circuit board, in a variety of ways, such as via a pin grid array, a land grid array, a ball grid array other configuration. The number of individual layers for the substrate 120 is largely a matter of design discretion. In certain exemplary embodiments, the number of layers may vary from four to sixteen. If such a build-up design is selected, a standard core, thin core or coreless arrangement may be used. The dielectric materials may be, for example, epoxy resin with or without fiberglass fill. Of course, the substrate 120 could be configured as something other than a package substrate, such as a printed circuit board serving as a motherboard, a daughter board, a card or some other type of board.

The underfill material 125 is designed to cushion and address issues of differing coefficients of thermal expansion for the substrate 120 and the semiconductor device 110. The underfill material 125 may be composed of well-known epoxy materials, such as epoxy resin with or without silica fillers and phenol resins or the like.

An optional lid 130 is shown exploded from the substrate 120. The lid 130 may be configured as a top hat design as disclosed that includes a crown portion 140 and a brim or rim portion 150. Optionally, the lid 130 may be configured as a bathtub design or some other configuration. The lid 130 may be secured to the substrate 120 by an adhesive composed of a well-known thixotropic adhesive or other well-known type of package adhesive as desired. However, the lid 130 may be omitted entirely if a lidless design is desired.

Figure 2:
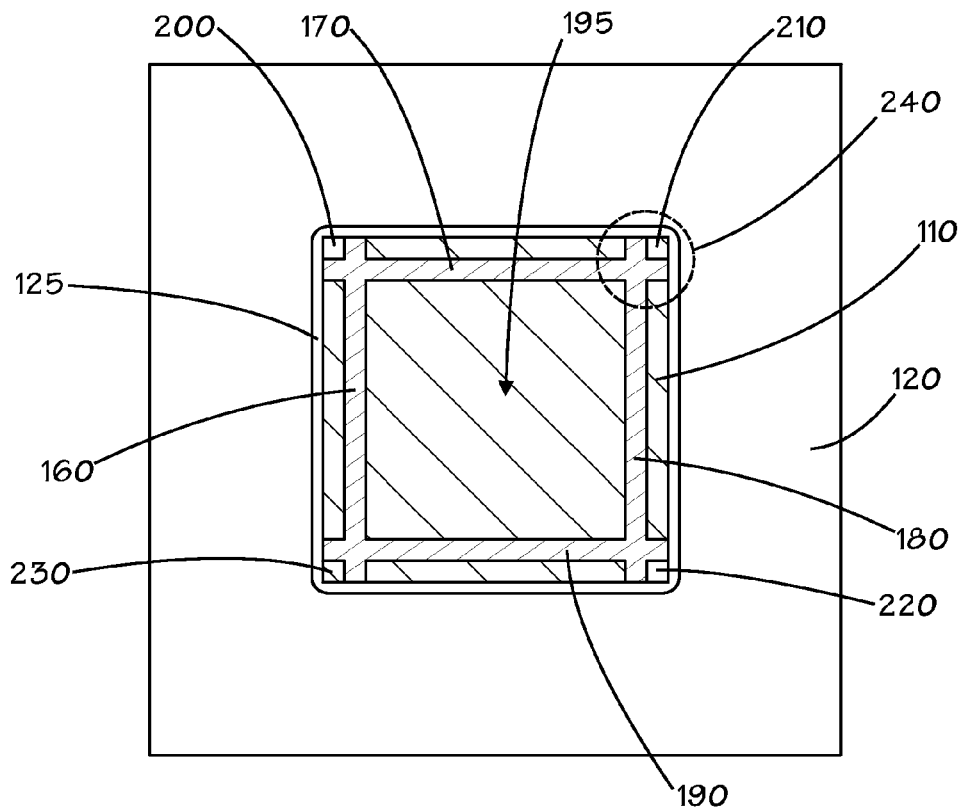
FIG. 2 is a sectional view of FIG. 1 taken at section 2-2.

Additional details of the semiconductor chip 110 may be understood by referring now to to FIG. 2, which is a sectional view of FIG. 1 taken at section 2-2. Note that the location of section 2-2 is such that the chip 110 appears in section but the underfill 125 and the substrate 120 do not. The chip 110 is provided with four crack stops 160, 170, 180 and 190 that circumscribe a central portion 195 of the chip 110. The operative circuitry of the chip 110 is located in the central portion 195. The crack stops 160, 170, 180 and 190 intersect near their respective ends so as to isolate the four corners 200, 210, 220 and 230 from the central portion 195 of the chip 110.

Figure 3:
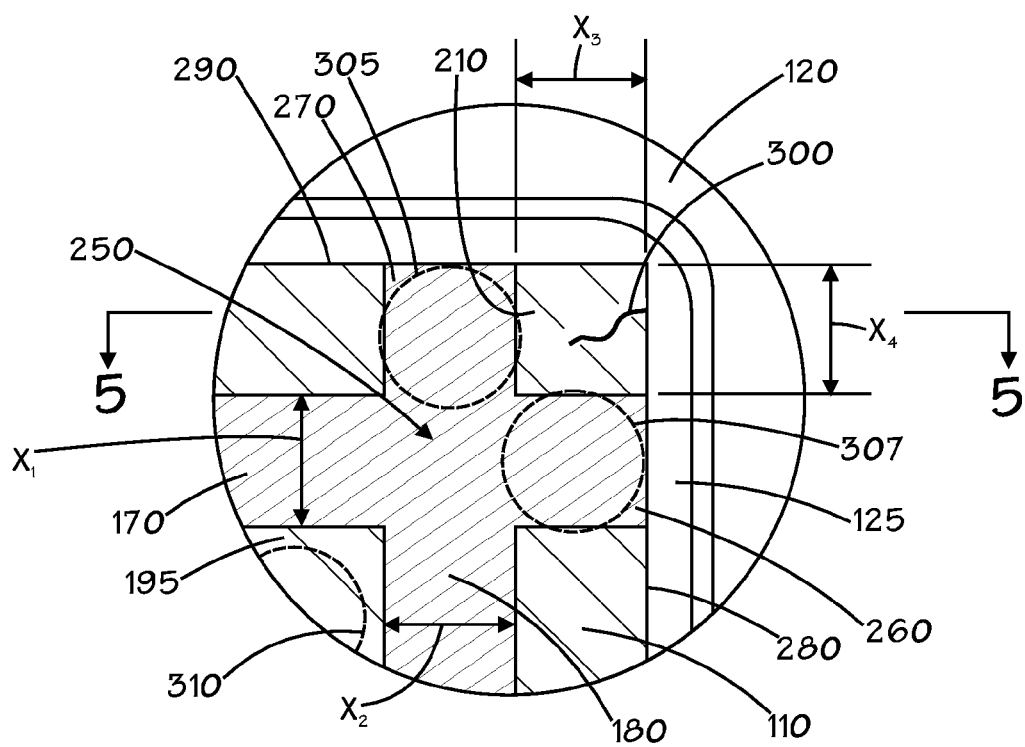
FIG. 3 is a magnified view of a portion of FIG. 2.

The portion of the chip 110 circumscribed by the dashed circle 240 in FIG. 2 is shown at greater magnification in FIG. 3. Attention is now turned to FIG. 3. The following description of the structure and function of the crack stops 170 and 180, their intersection 250, and the chip corner 210 will be illustrative of the other crack stops 160 and 190 and the corners 200, 220 and 230 shown in FIG. 2. The corner 210 of the chip 110 is shown in FIG. 3 along with the intersecting crack stops 170 and 180, a small portion of the underfill 125 and a small portion of the substrate 120. The intersection 250 of the crack stops 170 and 180 is configured so that projections 260 and 270 extend away, respectively, from the crack stops 170 and 180 to the edges 280 and 290 of the chip 110. In this way, the projections 260 and 270 effectively fence off the corner 210 of the chip 110 from the central portion 195 of the chip 110. Therefore, if a crack, such as the crack 300 depicted in the corner 210, begins to propagate, the crack 300 will be prevented from propagating into the central portion 195 of the chip 110 where sensitive circuit structures are located.

Three conductor structures 305, 307 and 310 are positioned between the chip 110 and the substrate 120 and thus are shown in phantom. The conductor structure 305 is positioned beneath the projection 270 of the crack stop 170 and the conductor structure 307 is positioned beneath the projection 260 of the crack stop 180. As described in more detail below, the conductor structures 305 and 307 may be dummy structures that provide additional mechanical support for the chip corner 210, and provide barriers to underfill delamination from the underfill 125 and the substrate 120. The conductor structure 310, only a portion of which is shown, is positioned beneath the central portion 195 of the chip 110. There may be many scores of such conductor structures 310 beneath the chip 110 to provide interconnects with the substrate 120.

The crack stop 170 and its projection 260 may have a width $X_1$. The crack stop 180 and its projection 270 may similarly have a width $X_2$ that may or may not be equal to the width $X_1$. The projection 260 may have a length, $X_3$, and the projection 270 may have a length, $X_4$, that may or may not be equal to the length, $X_3$, of the projection 290. Thus, the corner 250 will have a dimension, $X_3$, by, $X_4$. The dimensions $X_1$, $X_2$, $X_3$ and $X_4$ are largely matters of design discretion and may depend upon the prevailing lithographic techniques and the capacities thereof. In an exemplary embodiment, the dimensions, $X_1$ and $X_2$ may be about 40 to 80 μm and the dimensions, $X_3$ and $X_4$ may be about 40 to 60 μm. It should be understood that the crack stops 160, 170, 180 and 190 may be deemed to be part of one crack stop. It should also be understood that only certain corners could be provided with protection. In such cases, two or more projections could be used in lieu of all eight.

Figure 4:
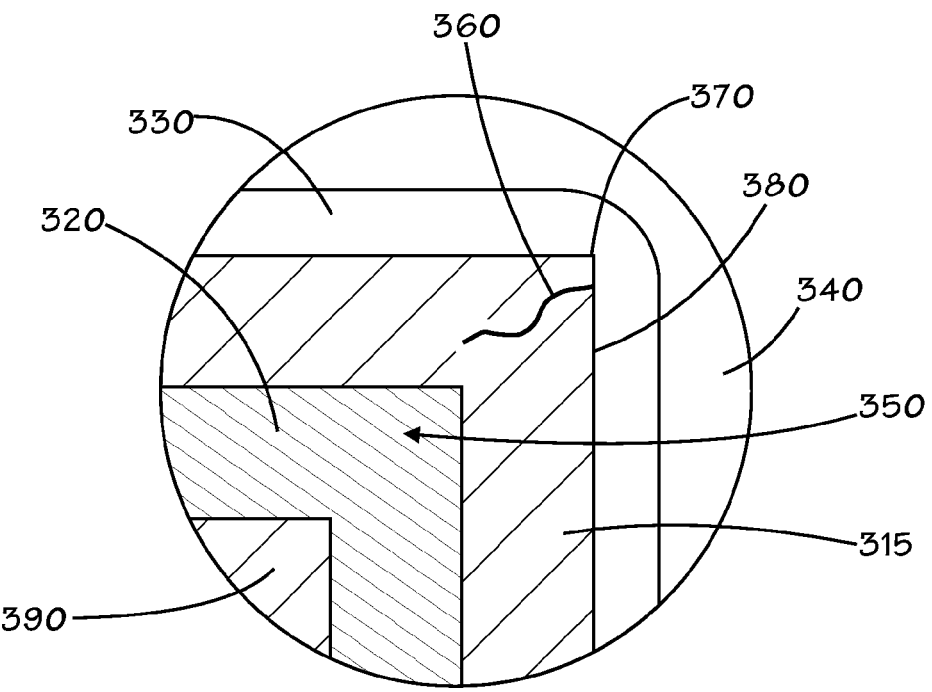
FIG. 4 is a view like FIG. 3, but of a conventional integrated circuit and package.

It will be useful at this point to contrast the exemplary embodiment depicted in FIGS. 1, 2 and 3 with a conventional crack stop configuration for a semiconductor chip. In this regard, attention is now turned to FIG. 4, which is a sectional view like FIG. 3, but of a conventional semiconductor chip 315 provided with a crack stop 320. The chip 315 is shown positioned on an underfill material 330. The chip 315 and the underfill 330 are positioned on a chip package substrate 340. The conventional crack stop 320 is a rectangular wall-like structure, a corner 350 of which is shown in FIG. 4. An exemplary crack 360 is shown propagating from a corner 370 of the chip 315. Because the conventional crack stop 320 does not constrain the propagation of the crack 360 proximate the corner 370, the crack 360 can propagate a significant distance away from an edge 380 toward a central portion 390 of the chip 315 before it encounters the crack stop 320. If the crack 360 achieves a minimum critical length, then the crack 360 can propagate substantially and can actually overcome the crack stopping properties of the conventional crack stop 320 and result in a device fault of some sort or another.

Figure 5:
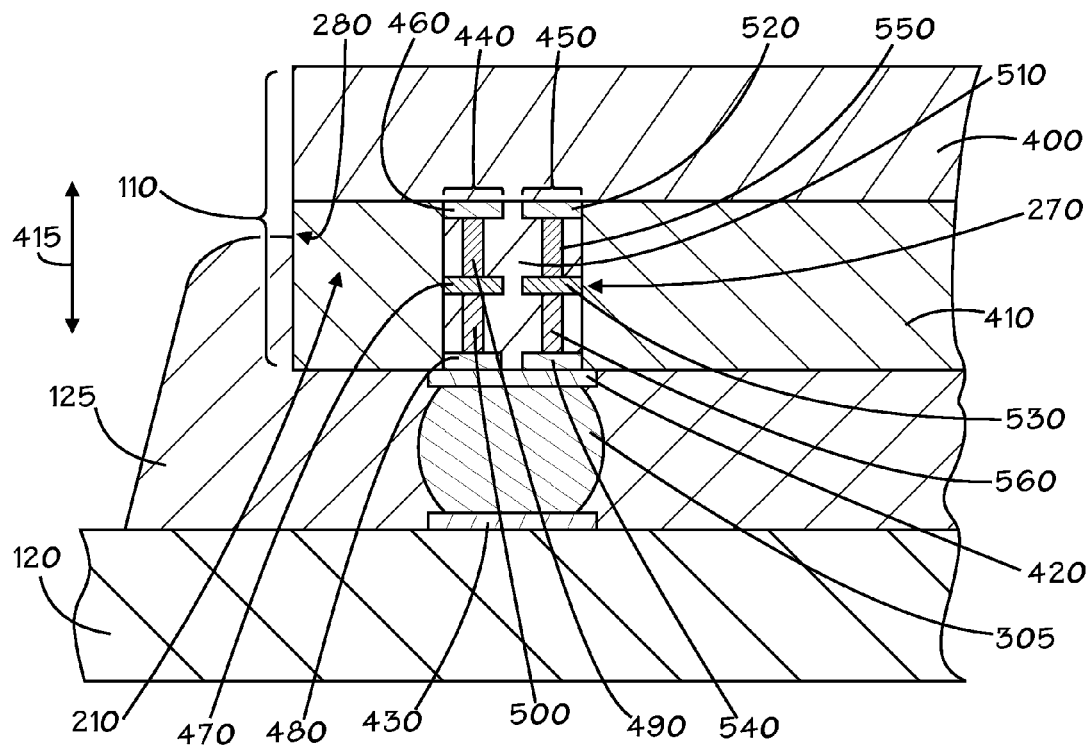
FIG. 5 is a sectional view of FIG. 3 taken at section 5-5.

Additional details of the projection 270 of the crack stop 180 may be understood by referring now to FIG. 5, which is a sectional view of FIG. 3 taken at section 5-5. The location of section 5-5 is such that the projection 270 and a portion of the semiconductor chip 110 appear in section, but the crack stop 170 and the projection 260 thereof are not visible. The semiconductor chip 110 is shown flip-chip mounted to the package substrate 120. The semiconductor chip 110 is depicted as a semiconductor-on-insulator configuration that includes an insulating substrate 400 to which a semiconductor portion 410 is attached. The crack stop projection 270 is positioned in the semiconductor portion 410. The underfill layer 125 is positioned primarily between the semiconductor chip 110 and the package substrate 120, but also adheres to a portion of the edge 280 of the chip 110. The conductor structure 305 that is shown in phantom in FIG. 3 is now visible and shown in section in FIG. 5. Functionally speaking, the conductor structure 305 is designed to provide a more robust mechanical coupling between the chip 110 and the substrate 120 proximate the projection 270 than is provided by the underfill 125. In this way, the chip 110 is restrained from excessive flexing near the chip corner 210, for example, along an axis 415, so that the odds of crack formation are reduced. The conductor structure 305 may be a solder structure, such as a solder bump. The solder may be lead-based or lead-free. The chip-to-substrate electrical interface will include many operative interconnects or structures. An example of one is shown in phantom and labeled 310 in FIG. 3. The conductor structure 305 may be fabricated at the same time and using the same processes used to fashion the operative conductor structures. As the operative conductor structures (see structure 310 in FIG. 3) utilize bonding pads, the conductor structure 305 may be formed between a bond pad 420 on the chip 110 and a bond pad 430 on the substrate 120. A reflow process may be performed to finalize the metallurgical contact between the structure 305 and the pads 420 and 430.

A myriad of configurations may be used for not only the crack stop projection 270, but also the crack stops 160, 170 and 190 shown in FIG. 3. In this illustrative embodiment, the crack stop projection 270 may consist of a pair of laterally spaced interconnect structures 440 and 450. The interconnect structure 440 may consist of a plurality of conductor layers, three of which are shown and labeled 460, 470 and 480. The conductor layers 460, 470 and 480 may be tied by vias 490 and 500 and isolated laterally by a dielectric 510. The interconnect structure 450 may similarly consist of a plurality of conductor layers 520, 530 and 540 that are tied by vias 550 and 560 and electrically isolated laterally by the dielectric 510. The dielectric 510 may be composed of multiple layers of insulating material. The conductor layers 460, 470, 480, 520, 530 and 540, the vias 490, 500, 550 and 560, and the dielectric 510 may be fabricated along with the other conductor and interlevel dielectric layers of the metallization scheme for the chip 110 as desired or may be separately fabricated using dedicated lithography and material deposition steps. A variety of materials may be used for the conductor layers 460, 470, 480, 520, 530 and 540, the vias 490, 500, 550 and 560, such as, for example copper, gold, silver, platinum, palladium, tantalum, titanium, aluminum, combinations of these or the like. The dielectric 510 may be composed of silicon oxides, silicon nitride, silicon oxynitride, polymeric materials, low-K, ultra low-K materials, an air gap or the like.

Figure 6:
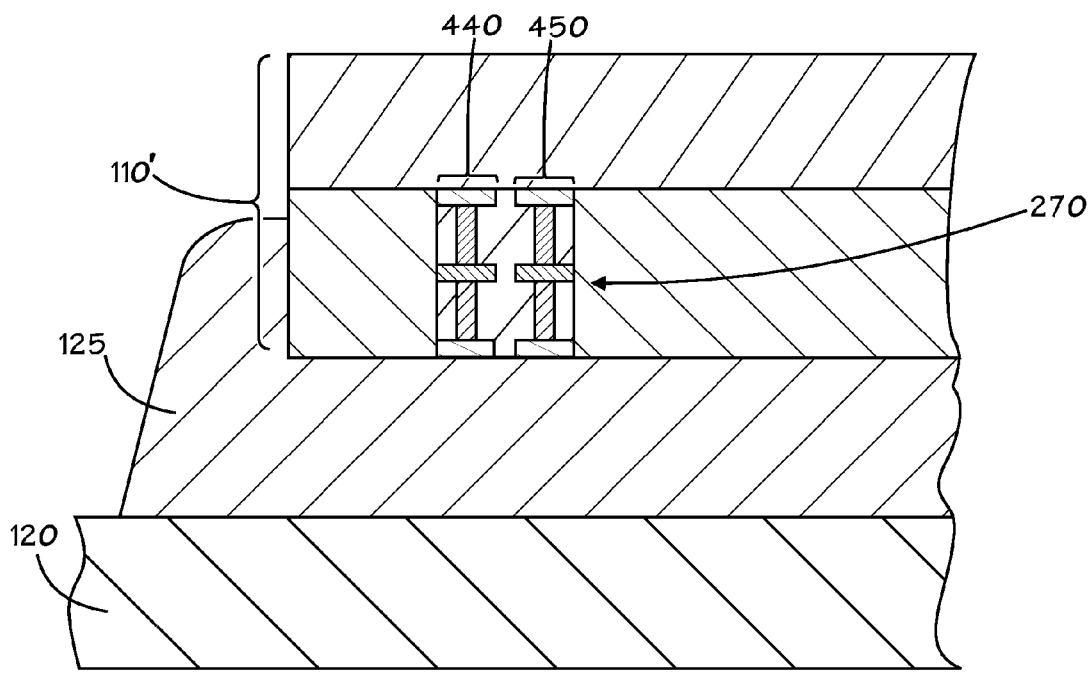
FIG. 6 is a sectional view like FIG. 5 but of an alternate exemplary embodiment of a semiconductor chip and substrate.

Attention is now turned to FIG. 6, which is a sectional view like FIG. 5 but of an alternate exemplary embodiment of a semiconductor chip 110. The chip 110' may be substantially identical to the chip 110 depicted in FIG. 3 and thus include multiple crack stops and projections, one of which is visible and again labeled 270. The projection 270 may consist of the aforementioned interconnect structures 440 and 450. In this illustrative embodiment, the conductor structure 305 depicted in FIG. 5 may be eliminated without materially affecting the crack stop abilities of the projection 270. The underfill 125 is still present to counter differential CTE issues related to the chip 110' and the package substrate 120.

Figure 7:
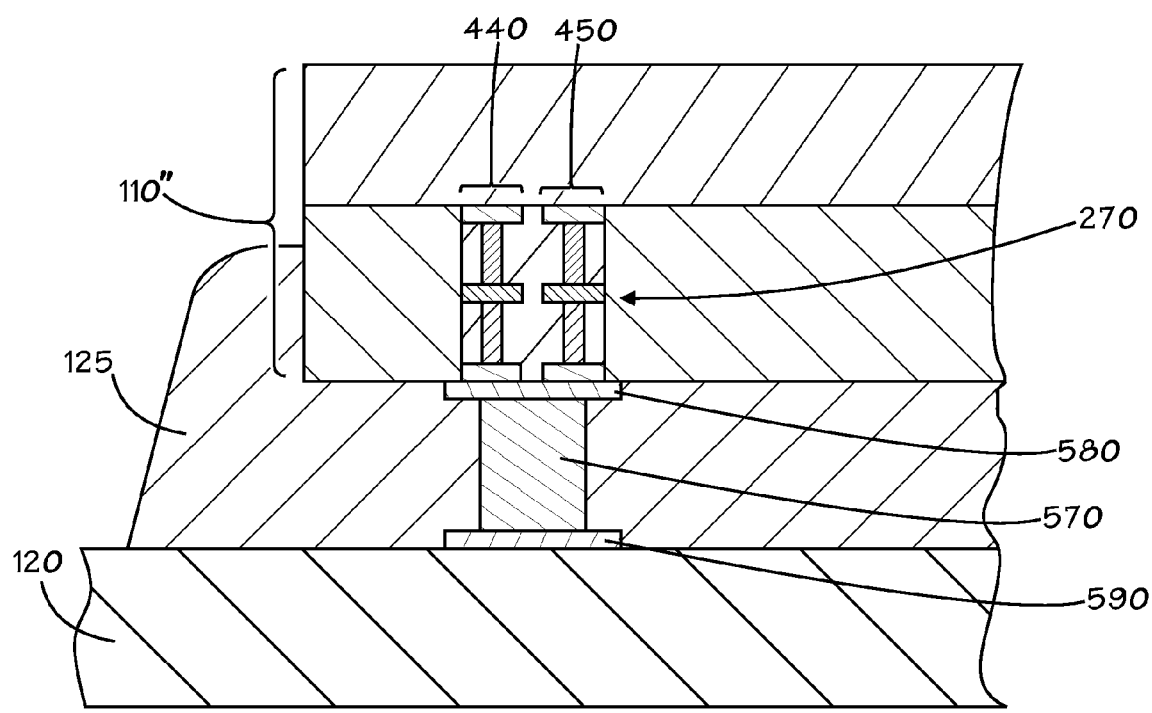
FIG. 7 is a sectional view like FIG. 5 but of another alternate exemplary embodiment of a semiconductor chip and substrate.

Attention is now turned to FIG. 7, which is a sectional view like FIG. 5 but of another alternate exemplary embodiment of a semiconductor chip 110". The chip 110" may be substantially identical to the chip 110 depicted in FIG. 3 and thus include multiple crack stops and projections, one of which is visible and again labeled 270. The projection 270 may consist of the aforementioned interconnect structures 440 and 450. However, in this embodiment, electrical interconnection between the chip 110" and the package substrate 120 may be provided by a plurality of conductor columns in lieu of conductor bumps. One of the columns 570 is visible in FIG. 7 and sandwiched between two bond pads 580 and 590 positioned beneath the crack stop projection 270. The column 570 may be fabricated along with the operative interconnects between the chip and substrate 120, but can be configured as a dummy if desired. The conductor column 570 may be composed of a variety of conductor materials such as, for example copper, gold, silver, platinum, palladium, tantalum, titanium, aluminum, combinations of these or the like. The underfill 125 is still present to counter differential CTE issues related to the chip 110" and the package substrate 120.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   providing a semiconductor substrate that includes a first principal surface and a second and opposite principal surface and a first corner defined by a first edge and a second edge; and
   forming a crack stop in the semiconductor substrate that does not project beyond the first principal surface and includes a first projection extending to the first edge and a second projection extending to the second edge to fence off a portion of the semiconductor substrate including the first corner.

2. The method of claim 1, comprising coupling the semiconductor substrate to a substrate.

3. The method of claim 2, wherein the coupling the semiconductor substrate to a substrate comprises flip-chip coupling the semiconductor substrate to the substrate.

4. The method of claim 2, comprising coupling a first conductor between the semiconductor substrate and the substrate proximate the first projection and a second conductor between the semiconductor substrate and the substrate proximate the second projection.

5. The method of claim 4, wherein the coupling the first and second conductors comprises coupling first and second solder balls.

6. The method of claim 4, wherein the coupling the first and second conductors comprises coupling first and second conductor pillars.

7. The method of claim 1, wherein the semiconductor substrate includes an insulating substrate positioned on the second principal surface, the method comprising forming the crack stop to extend at least to the insulating substrate.

8. A method of manufacturing, comprising:
   providing a rectangular semiconductor substrate that includes a first principal surface and a second and opposite principal surface, a first edge, a second edge, a third edge and a fourth edge that define a first corner, a second corner, a third corner and a fourth corner; and
   forming a crack stop in the semiconductor substrate that does not project beyond the first principal surface and includes a first projection, a second projection, a third projection, a fourth projection, a fifth projection, a sixth projection, a seventh projection and an eighth projection, the first projection extending to the first edge and the second projection extending to the second edge to fence off a portion of the semiconductor substrate including the first corner, the third projection extending to the second edge and the fourth projection extending to the third edge to fence off a portion of the semiconductor substrate including the second corner, the fifth projection extending to the third edge and the sixth projection extending to the fourth edge to fence off a portion of the semiconductor substrate including the third corner, the seventh projection extending to the fourth edge and the eighth projection extending to the first edge to fence off a portion of the semiconductor substrate including the fourth corner.

9. The method of claim 8, comprising coupling the semiconductor substrate to a substrate.

10. The method of claim 9, wherein the coupling the semiconductor substrate to a substrate comprises flip-chip coupling the semiconductor substrate to the substrate.

11. The method of claim 9, comprising coupling a conductor between the semiconductor substrate and the substrate proximate each of the eight projections.

12. The method of claim 11, wherein the coupling conductors comprises coupling a solder ball between the semiconductor substrate and the substrate proximate each of the eight projections.

13. The method of claim 11, wherein the coupling conductors comprises coupling a conductor pillar between the semiconductor substrate and the substrate proximate each of the eight projections.

14. A semiconductor chip, comprising:
a semiconductor substrate that includes a first principal surface and a second and opposite principal surface and a first corner defined by a first edge and a second edge; and
a crack stop in the semiconductor substrate that does not project beyond the first principal surface and includes a first projection extending to the first edge and a second projection extending to the second edge to fence off a portion of the semiconductor substrate including the first corner.

15. The semiconductor chip of claim 14, comprising a substrate coupled to the semiconductor substrate.

16. The semiconductor chip of claim 15, wherein the semiconductor substrate is flip-chip coupled to the substrate.

17. The semiconductor chip of claim 15, comprising a first conductor coupling between the semiconductor substrate and the substrate proximate the first projection and a second conductor coupled between the semiconductor substrate and the substrate proximate the second projection.

18. The semiconductor chip of claim 17, wherein the first and second conductors comprise first and second solder balls.

19. The semiconductor chip of claim 17, wherein the first and second conductors comprise first and second conductor pillars.

20. The semiconductor chip of claim 14, wherein the semiconductor substrate includes an insulating substrate positioned on the second principal surface and the crack stop extends at least to the insulating substrate.

* * * * *